(12) United States Patent
Matsuda et al.

(10) Patent No.: US 9,893,256 B2
(45) Date of Patent: Feb. 13, 2018

(54) METAL COATING METHOD, LIGHT-EMITTING DEVICE, AND MANUFACTURING METHOD FOR THE SAME

(71) Applicant: NICHIA CORPORATION, Anan-shi, Tokushima (JP)

(72) Inventors: Yoshikazu Matsuda, Tokushima (JP); Ryo Suzuki, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/169,133

(22) Filed: May 31, 2016

(65) Prior Publication Data
US 2016/0351768 A1    Dec. 1, 2016

(30) Foreign Application Priority Data

Jun. 1, 2015   (JP) ................................. 2015-111525
Feb. 25, 2016  (JP) ................................. 2016-034643

(51) Int. Cl.
  *H01L 33/48*    (2010.01)
  *H01L 33/62*    (2010.01)
  *H01L 33/54*    (2010.01)
  *H01L 33/64*    (2010.01)
  *H01L 33/50*    (2010.01)

(52) U.S. Cl.
  CPC .............. *H01L 33/62* (2013.01); *H01L 33/50* (2013.01); *H01L 33/54* (2013.01); *H01L 33/641* (2013.01); *H01L 33/647* (2013.01); *H01L 2933/005* (2013.01); *H01L 2933/0066* (2013.01); *H01L 2933/0075* (2013.01)

(58) Field of Classification Search
  CPC ..... H01L 33/36; H01L 33/382; H01L 33/385; H01L 33/387; H01L 33/40; H01L 33/62; H01L 33/64; H01L 33/641; H01L 33/644; H01L 33/486; H01L 33/50; H01L 33/505; H01L 33/507
See application file for complete search history.

(56) References Cited

U.S. PATENT DOCUMENTS

| | | | |
|---|---|---|---|
| 5,019,535 A | 5/1991 | Wojnarowski et al. | |
| 5,071,359 A | 12/1991 | Arnio et al. | |
| 5,221,426 A * | 6/1993 | Tessier | H01L 21/32131 216/49 |
| 5,245,751 A | 9/1993 | Locke et al. | |

(Continued)

FOREIGN PATENT DOCUMENTS

| | | |
|---|---|---|
| JP | H04-230984 A | 8/1992 |
| JP | 2005-285836 A | 10/2005 |

(Continued)

*Primary Examiner* — Matthew Landau
*Assistant Examiner* — Scott Stowe
(74) *Attorney, Agent, or Firm* — Foley & Lardner LLP

(57) ABSTRACT

A metal coating method includes forming a metal layer on a substrate including a first member and a second member, the second member having a lower thermal conductivity than a thermal conductivity of the first member, and irradiating the metal layer formed on the first member and the second member with a laser beam such that, after irradiation, the metal layer formed on the first member remains, and the metal layer formed on the second member is removed.

15 Claims, 11 Drawing Sheets

(56) References Cited

U.S. PATENT DOCUMENTS

| | | | |
|---|---|---|---|
| 2011/0297994 A1 | 12/2011 | Sugizaki et al. | |
| 2012/0302124 A1* | 11/2012 | Imazu | H01L 33/486 445/58 |
| 2014/0299902 A1* | 10/2014 | Zimmerman | H01L 33/62 257/98 |
| 2015/0091035 A1* | 4/2015 | Kim | H01L 33/54 257/98 |
| 2015/0155461 A1* | 6/2015 | Ling | H01L 33/54 257/88 |
| 2016/0254428 A1* | 9/2016 | Ting | H01L 33/0079 |

FOREIGN PATENT DOCUMENTS

| | | |
|---|---|---|
| JP | 2011-253999 A | 12/2011 |
| JP | 2012-227470 A | 11/2012 |

\* cited by examiner

B-B

METAL COATING METHOD, LIGHT-EMITTING DEVICE, AND MANUFACTURING METHOD FOR THE SAME

CROSS-REFERENCE TO RELATED APPLICATIONS

The present application claims priority under 35 U.S.C.§ 119 to Japanese Patent Application No. 2015-111525, filed Jun. 1, 2015, and Japanese Patent Application No. 2016-034643, filed on Feb. 25, 2016. The contents of these applications are incorporated herein by reference in their entireties.

BACKGROUND

The present disclosure relates to a metal coating method, a light-emitting device and a manufacturing method for the same.

A surface of an electrode of an electronic component may be coated with another metal so as to prevent corrosion of the electrode. In this case, for example, after a metal film is formed on the entire surface of the electronic component including the electrode, resist patterns are formed and the metal film is etched, thereby forming a predetermined shape. For example, Japanese Unexamined Patent Application Publication No. 2012-227470 discloses a light-emitting device in which plated electrodes patterned in a predetermined shape are provided on the surface on the side opposite to a light emission surface, and the plated electrodes are formed by a combination of photolithography and an electrolytic plating method.

SUMMARY

A metal coating method according to an embodiment of the present invention, includes forming a metal layer on a substrate including a first member and a second member, the second member having a lower thermal conductivity than a thermal conductivity of the first member, and irradiating the metal layer formed on the first member and the second member with a laser beam such that, after irradiation, the metal layer formed on the first member remains, and the mental layer formed on the second member is removed.

DETAILED DESCRIPTION

Hereinafter, the embodiments of the present invention will be described in detail based cm drawings. It is noted that, in the description below, terms representing specific directions or position (for example, the terms "up", "down", "right", and "left", and other terms inclusive of the aforementioned terms) are employed as needed. The use of the terms is merely aimed at facilitating the understanding of the present invention with reference to the drawings, but the technical scope of the present invention is not limited by the meanings of the terms. Also, the same reference number illustrated in a plurality of drawings represents the same portion or member.

First Embodiment

Figure 1A:
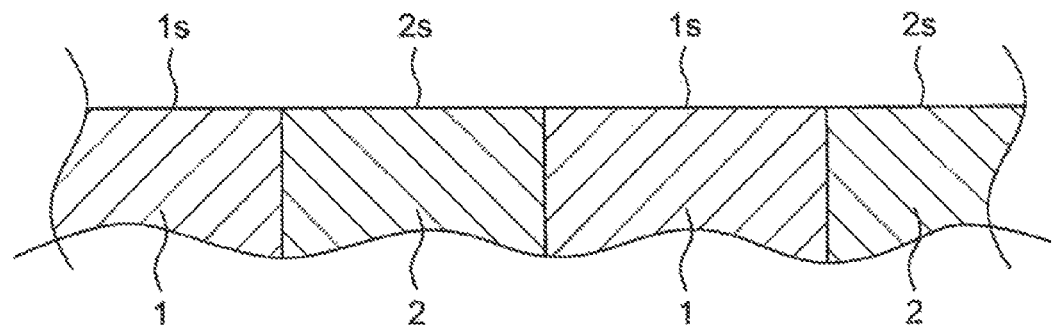
FIG. 1A is a schematic cross-sectional view of a substrate having a first member and a second member.
Figure 1B:
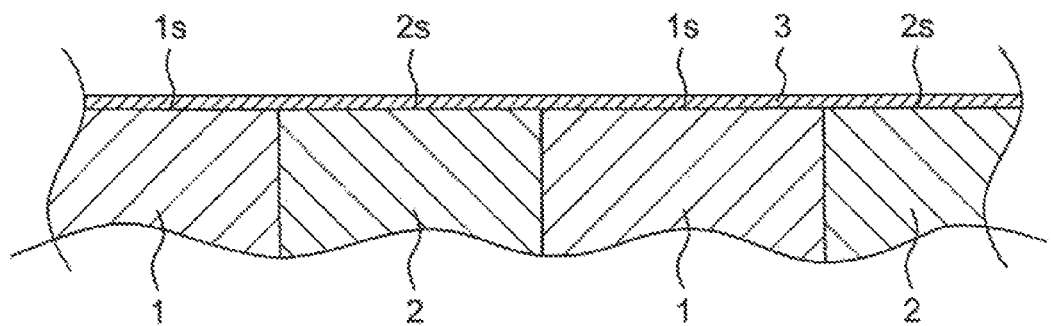
FIG. 1B is a schematic cross-sectional view in which a metal layer is formed on the entire substrate of FIG. 1A, according to a metal coating method of a first embodiment of the present invention.
Figure 1C:
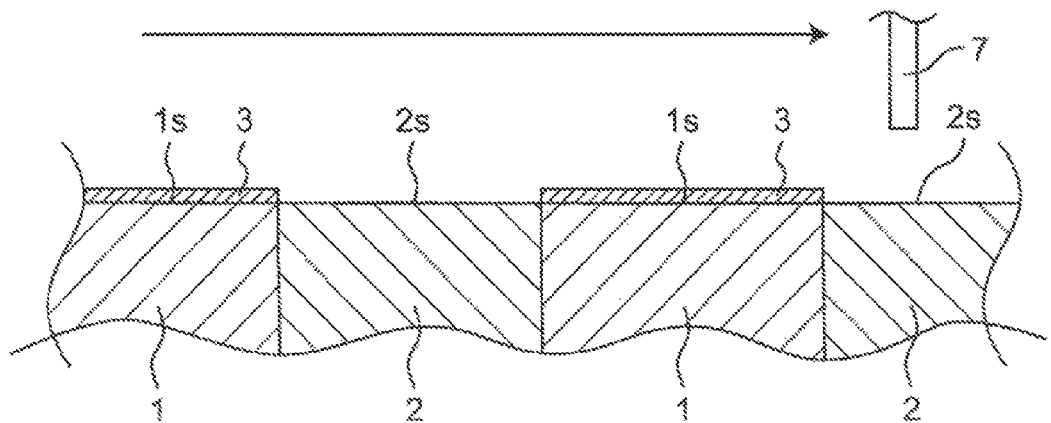
FIG. 1C is a schematic cross-sectional view in which the metal layer of FIG. 1B is irradiated with a laser beam, where a portion of the metal layer on the first member remains, and a portion of the metal layer on the second member is removed, in accordance with the metal coating method of the first embodiment.

Referring to a metal coating method of a first embodiment of the present invention, as illustrated in FIG. 1A, a substrate includes a first member 1 and a second member 2, for example, having a lower thermal conductivity than that of the first member 1. A surface 1s of the first member 1 and a surface 2s of the second member are exposed on the surface of the substrate. The metal coating method of the first embodiment is a method for coating the surface 1s of the first member 1 with metal, while the surface 2s of the second member 2 remains uncoated. The metal coating method includes a first step and a second step described below. In the first step, as illustrated in FIG. 1B, a metal layer 3 is formed that is continuously disposed on the surface 1s of the first member 1 and the surface 2s of the second member 2. In the second step, as illustrated in FIG. 1C, a laser beam of a laser light source 7 irradiates the whole metal layer 3, leaving the metal layer 3 formed on the first member 1, and removing the metal layer 3 formed on the second member 2.

Patterning and plating using resist may require large-scale facilities, involve high equipment costs, and may increase manufacturing costs. Also, chemical resistance (for example, acid, alkali, acetone) may be required to be patterned on the surface. Thermal resistance (i.e., resistance for contraction by heat) may also be required. Therefore, the aforementioned method may be difficult to apply to a resin mold that exhibits low chemical resistance and thermal resistance.

Accordingly, it is an object of certain embodiments of the present invention to provide a metal coating method that involves less equipment costs and can form metal films, even in the case where a resin mold that exhibits low chemical resistance and thermal resistance is exposed on a surface.

According to a certain embodiments of the present invention, the metal coating method includes irradiating a metal layer disposed on a first member and a second member with a laser beam, leaving the metal layer formed on the first member, and removing the metal layer formed on the second member. Such a metal coating method involves less equipment costs and can form metal films, even in the case where a resin mold that exhibits low chemical resistance and thermal resistance is exposed on a surface.

Here, in the metal coating method of the first embodiment, laser ablation is applied to patterning such that a portion of the metal layer 3 formed on the second member 2 is removed, and a portion of the metal layer 3 formed on the first member 1 is left. That is, in the metal coating method of the first embodiment, even in the case where a laser beam having the same intensity is irradiated under the same condition, the effect of the laser ablation depends on the difference of surface characteristics such as dissipation and thermal conductivity on the surface, and such difference is applied to the patterning of the metal layer 3, thereby completing the metal coating method.

Laser ablation is a phenomenon in which, in the case where the irradiation intensity of a laser beam irradiated on the surface of a solid body is greater than or equal to a certain magnitude (i.e., a threshold value), the surface of the solid body is removed. The generation of the laser ablation requires the surface of the solid body and its neighborhood to be greater than or equal to a certain temperature. Accordingly, the threshold value of the irradiation intensity of the laser beam that generates the laser ablation depends on the heat dissipation properties of the surface and the thermal conduction properties of the solid body. Even in the case where the laser beam having the same intensity is irradiated under the same condition, it is possible to generate the laser ablation on the surface of a certain solid body and to not generate the laser ablation on the surface of another solid body.

An increase in temperature on the surface of a solid body relates to the dissipation properties of the surface of the solid body. The dissipation properties mainly relate to the following three items: (1) properties of thermal conduction such as thermal conductivity of a solid body itself; (2) thermal transmission, for example, due to the transfer of gas on the surface of the solid body; and (3) thermal radiation. In particular, the thermal conductivity of a solid body itself could be important in the patterning via laser ablation on the surface of the solid bodies having different dissipation properties.

In the metal coating method of the first embodiment, the patterning is a method including irradiating a metal layer 3 with a laser beam, where the metal layer 3 is formed on a surface that includes the surface 1s of the first member 1 and the surface 2s of the second member 2, which have respectively different dissipation properties. The metal layer 3 on the surface 1s of the first member 1 is left, and the metal layer 3 on the surface 2s of the second member 2 is removed. Accordingly, the thermal conductivity of the solid body itself described herein refers to the thermal conductivity of the first member 1 and the thermal conductivity of the second member 2. It is noted that to some extent, the thermal conductivity may be affected by thermal radiation properties attributed to a difference in surface unevenness. The surface unevenness refers to depressions and projections on the surface of the metal layer 3, and in the case where the depressions and projections on the surface of the metal layer 3 are formed so as to correspond to the depressions and projections on the surfaces of the first member 1 and the second member 2, it can be said that the surface unevenness refers to the surface unevenness of the first member 1 and/or the surface unevenness of the second member 2. Accordingly, it is possible to differentiate the dissipation properties of the metal layer 3 on the first member 1 and the dissipation properties of the metal layer 3 on the second member 2 by differentiating the surface unevenness of the first member 1 and the surface unevenness of the second member 2.

In the second step, it may be such that the irradiation spot of the laser beam is continuously or intermittently (sequentially) applied on the surface, thereby irradiating the entire metal layer 3 with the laser beam. The laser beam may be operated continuously or in the form of pulses to carry out the irradiation. The intensity of the laser beam, the diameter of the irradiation spot, and the moving speed of the irradiation spot can be set in consideration of the thermal conductivity of the first member 1 and the thermal conductivity of the second member, and a difference between the thermal conductivity of the first member 1 and the thermal conductivity of the second member in such a manner that, in the case where the metal layer 3 on the second member 2 id irradiated with the laser beam, laser ablation occurs, and in the case where the metal layer 3 on the first member 1 is irradiated with the laser beam, laser ablation does not occur. Accordingly, in the case where irradiation includes continuous operation of the laser beam, and the irradiation spot is continuously applied on the surface, the moving speed can be set in consideration of the dissipation properties of the first member 1 and the second member 2, the intensity of the laser beam, and the diameter of the irradiation spot. Also, in the case where the irradiation spot of the laser beam is intermittently applied (i.e., when the laser beam is pulsed), the timing of moving the irradiation spot can be set in consideration of the width of pulses, in addition to the intensity of the laser beam and the diameter of the irradiation spot, and after the irradiation spot is stopped for a predetermined period of time, the irradiation spot is sequentially applied to an adjacent position. In the case where the irradiation spot of the laser beam in the form of pulses is sequentially applied, for example, the irradiation spot can be applied to the adjacent position while the laser beam is not in operation (i.e., in between pulses). In certain embodiments, it is preferable that the wavelength of the laser beam be selected in such a manner that the reflectivity on the metal layer 3 is low, for example, 90 percent or lower. for example, in the case where the uppermost surface of the metal layer 3 is made of Au, it is preferable to use a laser having a wavelength shorter than the wavelength of the laser in a green region (e.g., 550 nm), rather than using a laser having a wavelength of the laser in a red region (e.g., 640 nm). Accordingly, the laser ablation can be efficiently generated, and productivity can be enhanced. The metal layer 3 at least covers the first member 1 and the second member 2. In certain embodiments, it is preferable that the metal layer 3 be provided such that the metal layer 3 covers substantially the whole substrate. This eliminates the patterning of the metal film, which simplifies the step. Only a portion of the metal layer 3 contiguously disposed with the surface 1s of the first member 1 and the surface 2s of the second member 2 needs to be irradiated with the laser. The whole of the metal layer 3 does not need to be irradiated. In other words, at least a part of the metal layer 3 on the first member 1 and a part of the metal layer 3 on the second member 2 are irradiated with the laser beam. However, in certain embodiments, scanning of the laser beam can be simplified and efficiency of production can be enhanced by irradiating the whole of the metal layer 3 with the laser beam.

In the metal coating method of the first embodiment described above, after the metal layer 3 continuously disposed with the surface 1s of the first member 1 and the surface 2s of the second member 2 is formed, the metal layer 3 on the first member 1 is left, and the metal layer 3 on the second member 2 is removed by the laser ablation. Accordingly, acid or alkaline liquid, or organic solvents such as acetone may not be used during the patterning, so that resin having a low chemical resistance can be used as the second member 2. Various materials can be selected for the first member 1 and the second member 2.

Also, in the laser ablation, the patterning can be performed only by locally exposing the metal layer 3 on which the laser beam is irradiated, and the neighborhood of the metal layer 3 to a high temperature for a short period of time, so that the whole of the first member 1 and the second member 2 is not exposed to a high temperature for a long period of time. Accordingly, the materials that have a low thermal resistance can be selected for the first member 1 and the second member 2.

In the case where the metal film is patterned using masking or the scanning of the pattern by a laser beam, a shift in the position of masking or the precision of image recognition during the scanning of the pattern sometimes makes it difficult to appropriately arrange the metal film on the first member 1. However, according to the method of the present embodiment, the metal film can be steadily formed on the first member 1.

As described above, the metal coating method of the first embodiment is a method for coating the surface 1s of the first member 1 with metal, but not coating the surface 2s of the second member 2, where the substrate includes the first member 1 and the second member 2, whose thermal conductivity is lower than that of the first member 1, or whose heat dissipation is inferior to that of the first member 1, and the surface 1s of the first member 1 and the surface 2s of the second member are exposed on the surface of the substrate. The metal coating method of the first embodiment can be applied to the substrate that includes the first member 1 and the second member 2 whose thermal conductivity is lower than that of the first member 1, but it is preferable that a great difference exist between the thermal conductivity of the first member 1 and the thermal conductivity of the second member 2. For example, the first member 1 is a member that is made of metal or includes metal as a main component. Herein, it is preferable that the thermal conductivity of the members be different by 500 times or more, more preferably, 1000 times or more. In another example, ceramics such as alumina and aluminum nitride can be used for the first member 1. The second member 2 may be a member whose thermal conductivity is considerably different from that of the first member 1, for example, a member that is made of resin or includes resin as a main component.

Second Embodiment

Figure 2A:
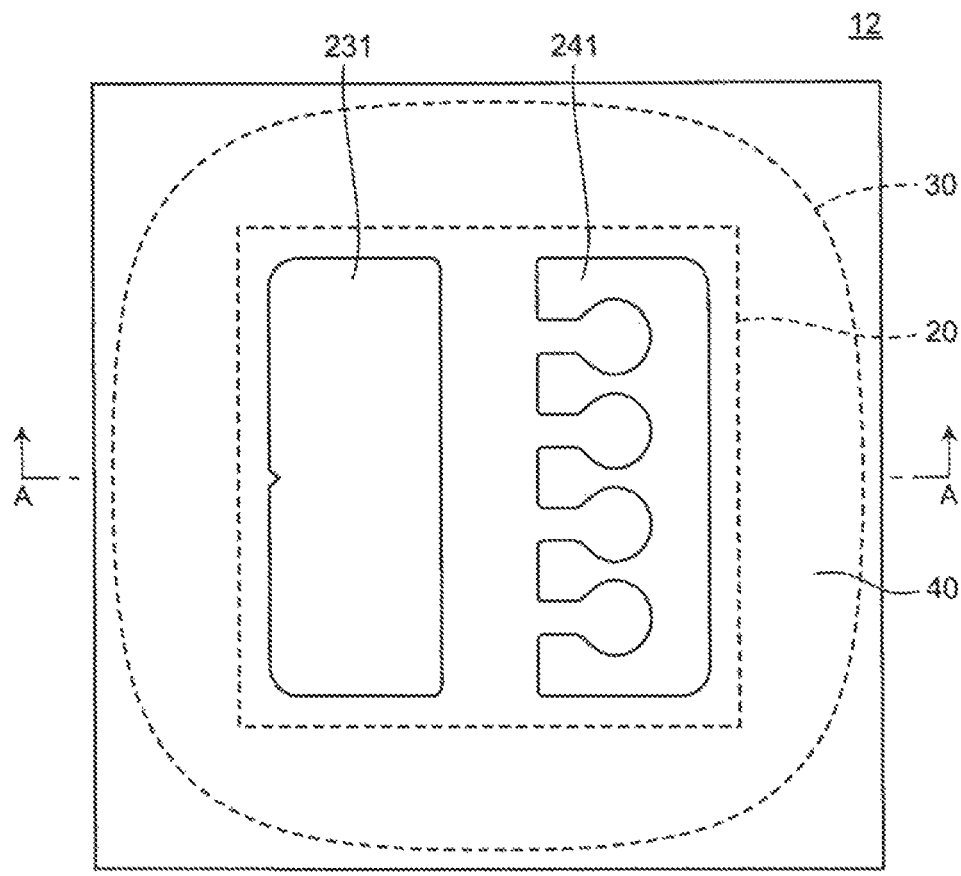
FIG. 2A is a schematic plan view of a light-emitting device according to a second embodiment of the present invention.
Figure 2B:
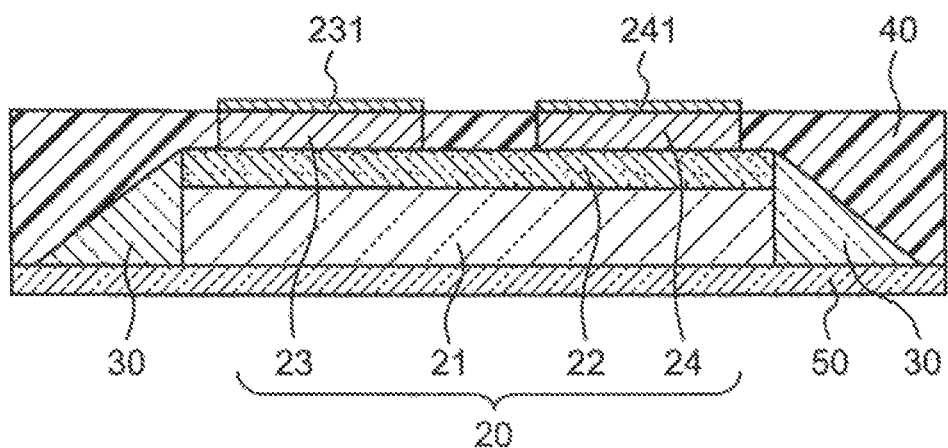
FIG. 2B is a schematic cross-sectional view taken along line A-A in FIG. 2A.

A light-emitting device of a second embodiment of the present invention is a light-emitting device that is produced by applying the metal coating method of the first embodiment. FIG 2A is a schematic plan view of the light-emitting device of the second embodiment, and FIG. 2B is a schematic cross-sectional view taken along line A-A in FIG. 2A.

Figure 2C:
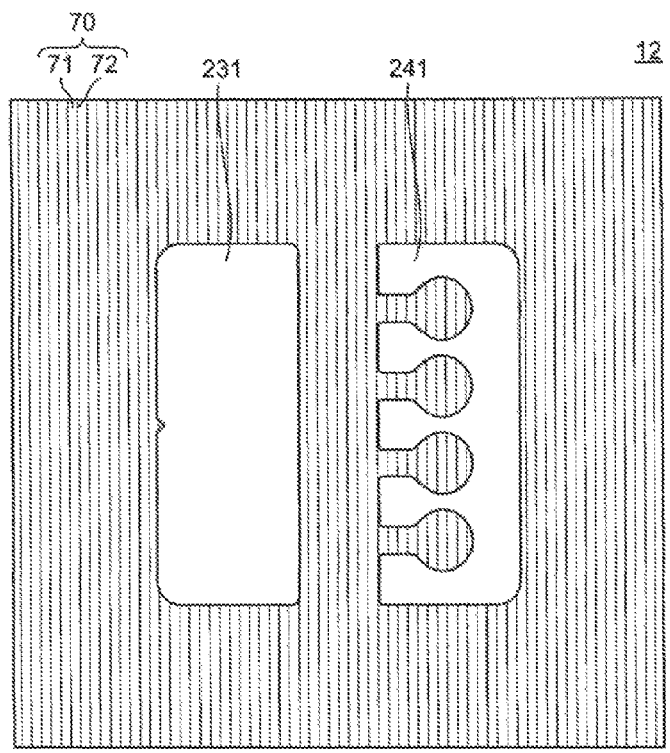
FIG. 2C is a view schematically illustrating laser irradiation marks on the schematic plan view of the light-emitting device of FIG. 2A, according to the second embodiment.
Figure 2D:
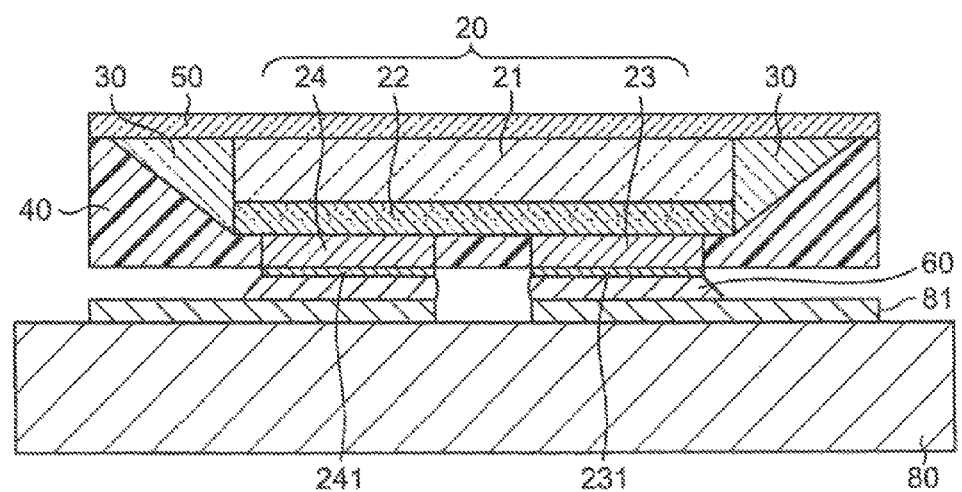
FIG. 2D is a schematic cross-sectional view illustrating a state where the light-emitting device of FIG 2A is mounted on a mounting substrate that includes wiring electrodes.

A light-emitting device 12 according to the second embodiment includes a light-emitting element 20, a light transmissive member 30 that covers the lateral surface of the light-emitting element 20, a coating member 40 that coats the light-emitting element 20 and the light transmissive member 30 and includes a light reflectivity material and resin, and a tabular wavelength conversion member 50 provided on the light-emitting element 20, the light transmissive member 30, and the coating member 40. Herein, the electrodes 23 and 24 of the light-emitting element 20 are exposed on the mounting surface side (the upper side in FIG. 2B) of the light-emitting device 12, and metal layers 231 and 241 are respectively formed on the exposed surfaces of the electrodes 23 and 24, which are made of Cu. The metal layers 231 and 241 are formed by the metal coating method of the first embodiment. In the second embodiment, the electrodes 23 and 24 correspond to the first member 1 of the first embodiment, and the coating member 40 corresponds to the second member 2 of the first embodiment. The magnitude of the light-emitting element 20 of the present embodiment is about 1000 µm×1000 µm in a plan view. The light-emitting element includes a pair of electrodes made of Cu on one surface side. The magnitudes of the Cu electrodes 23 and 24 are about 330 µm×860 µm, and the thicknesses of the Cu electrodes 23 and 24 are approximately 50 µm. The electrode 24 includes a plurality of concave portions on the edge on the side opposite to the electrode 23. The concave portions are filled with the coating member 40. Laser irradiation marks 70 formed by irradiation with the laser beam may be formed on the mounting surface side of the coating member 40. For example, as illustrated in FIG. 2C, a plurality of grooves 71 are formed, and the grooves 71 are formed, for example, in stripes in accordance with the moving direction of the light source of the laser beam. The portion of resin included in the coating member 40 is removed by the laser ablation via the irradiation with the laser beam, thereby forming the grooves 71. In FIG. 2C, portions illustrated with a reference number 72 represent ridge portions formed in stripes and disposed between the adjacent grooves 71. In the light-emitting device 12, external connecting electrodes are comprised of the electrodes 23 and 24 buried in the coating member 40 and the metal layers 231 and 241. As illustrated in FIG. 2D, the light-emitting device 12 may be mounted on a mounting substrate 80 that includes wiring electrodes 81. For example, the metal layers 231 and 241 may be joined with the wiring electrodes 81 using a conductive joining member 60 such as solder.

In the light-emitting device 12 according to the second embodiment, the light-emitting element 20 includes a light transmissive substrate 21 and a semiconductor stacked body 22 provided on the light transmissive substrate 21 such that the light emitted from the semiconductor stacked body 22 is emitted from the side of the light transmissive substrate 21.

In the light-emitting device 12 according to the second embodiment, the light transmissive member 30 joins the light-emitting element 20 on the wavelength conversion member 50, covers at least part of the lateral surface of the light-emitting element 20, and extracts the light from the lateral surface of the light-emitting element 20.

In the light-emitting device 12 according to the second embodiment, the coating member 40 is provided in such a manner as to cover the light-emitting element 20 and the light transmissive member 30 except for a light emission surface of the light-emitting element on the side near to the wavelength conversion member 50 and the surfaces of the electrodes 23 and 24, so as to protect the light-emitting element 20. Accordingly, it is preferable that the coating member 40 be comprised of materials that have good weather resistance and light resistance, so as to protect the light-emitting element and the like for a long period of time. Also, the light transmissive member 30 and the light-emitting element 20 are adjacently provided. Therefore, it is preferable that the light transmissive member 30 and the light-emitting element 20 be comprised of materials in which a difference between the coefficients of the thermal expansion of the light transmissive member 30 and the light-emitting element 20 satisfies a predetermined relation.

Furthermore, in the light-emitting device 12 according to the second embodiment, it is preferable that the coating member 40 be comprised of light reflective resin, thereby enhancing the efficiency of extraction of light emitted from the light emission surface. The coating member 40 made of the light reflective resin covers the surface of the light-emitting element 20 that is not covered with the surface of the light transmissive member 30, reflects the light emitted from the surface, and emits the light from the light emission surface, thereby further enhancing the efficiency of light extraction. Also, in the light-emitting device 12 according to the second embodiment, a portion of the light advancing to the lateral surface of the light-emitting element 20, which is emitted from the semiconductor stacked body 22, may be reflected on an interface between the light-emitting element 20 and the light transmissive member 30 and emitted from the light emission surface, but another portion of the light may enter the light transmissive member 30. The incident light in the light transmissive member 30 can be reflected on an interface between the light transmissive member 30 and the coating member 40 and extracted from the light emission surface. Thus, the light-emitting device 12 according to the second embodiment can efficiently extract the light emitted on the semiconductor stacked body 22 from the light emission surface and can improve the efficiency of light extraction.

The material of the coating member 40 may be selected so as to efficiently fulfill the function of covering the light-emitting element 20 and enhancing the reliability of the light-emitting device 12 and the function of enhancing the efficiency of light extraction. Accordingly, in the case where a resin having good chemical resistance is selected in consideration of forming the metal layers 231 and 241 respectively on the surfaces of the electrodes 23 and 24, in addition to the fulfillment of the functions described above, it may be difficult to select appropriate resin materials. However, the light-emitting device 12 of the second embodiment can be formed such that the metal layer is left on the electrodes 23 and 24, and the metal layer on the surface of the coating member 40 is removed by the laser ablation, so that the resin materials that enhance the reliability of the light-emitting device and the efficiency of light extraction can be selected from among a variety of resins without taking consideration of the chemical resistance.

Manufacturing Method for Light-Emitting Device of Second Embodiment

The manufacturing method for the light-emitting device 12 according to the second embodiment will be described with reference to FIGS. 3 to 9. In the manufacturing method, a plurality of light-emitting devices 12 can be simultaneously manufactured.

Step 2-1. Application of Light Transmissive Member 30

Figure 3A:
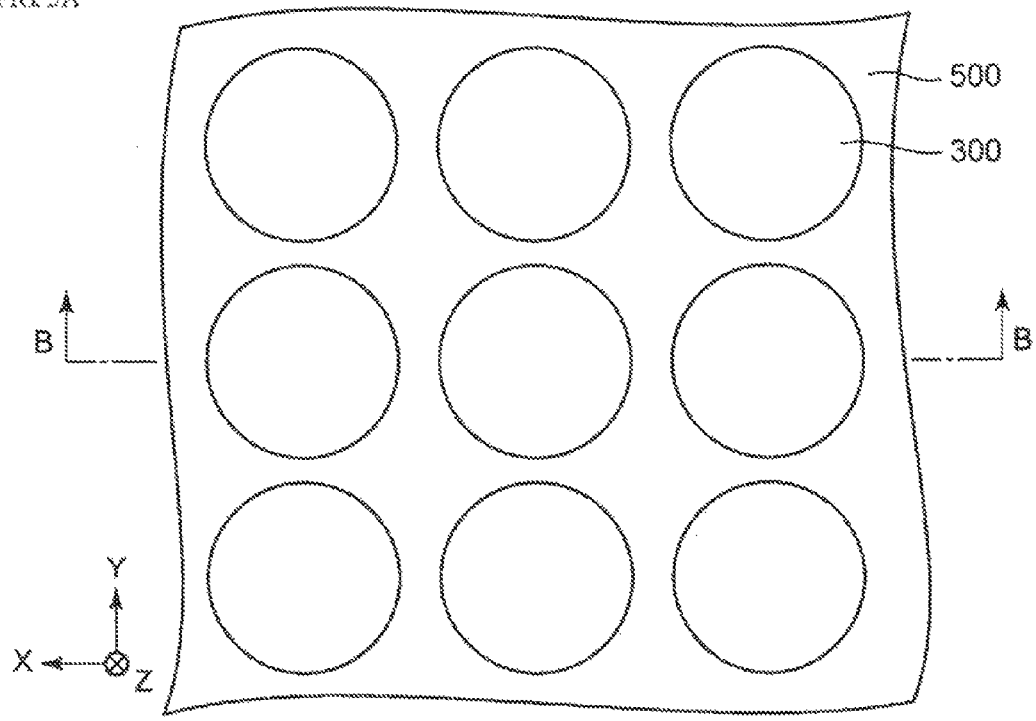
FIG. 3A is, a schematic plan view illustrating a case where a liquid resin material for a light transmissive member is applied, in a step 2-1 in the manufacturing method for the light-emitting device according to the second embodiment.
Figure 3B:
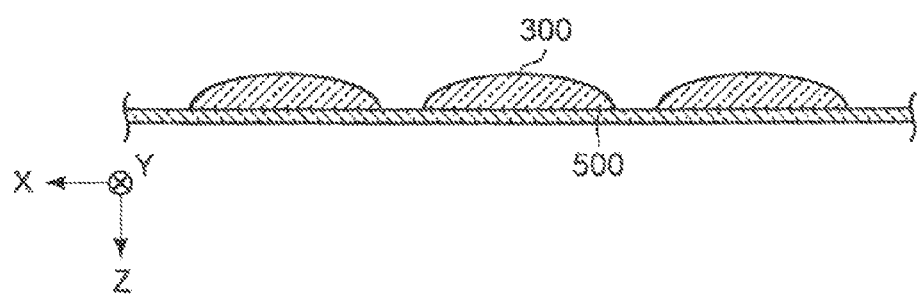
FIG. 3B is a schematic cross-sectional view illustrating a case where a liquid resin material for a light transmissive member is applied, in a step 2-1 in the manufacturing method for the light-emitting device according to the second embodiment.

As illustrated in FIGS. 3A and 3B, liquid resin materials 300 used for forming the light transmissive member 30 are applied in plural insular shapes separated from each other on the upper surface of a large-size wavelength conversion sheet 500. Each liquid resin material 300 can be formed in an arbitrary shape in accordance with the shape of the light-emitting element 20 in a plan view, for example, in a circle, ellipse, square, or rectangle. The intervals between the adjacent liquid resin materials 300 formed in an insular shape can be appropriately set in accordance with the external shape of the light-emitting device 12 and the number of light-emitting devices 12 to be manufactured.

Step 2-2. Fixation of Light-emitting Element 20 and Hardening of Liquid Resin Material 300

Figure 4A:
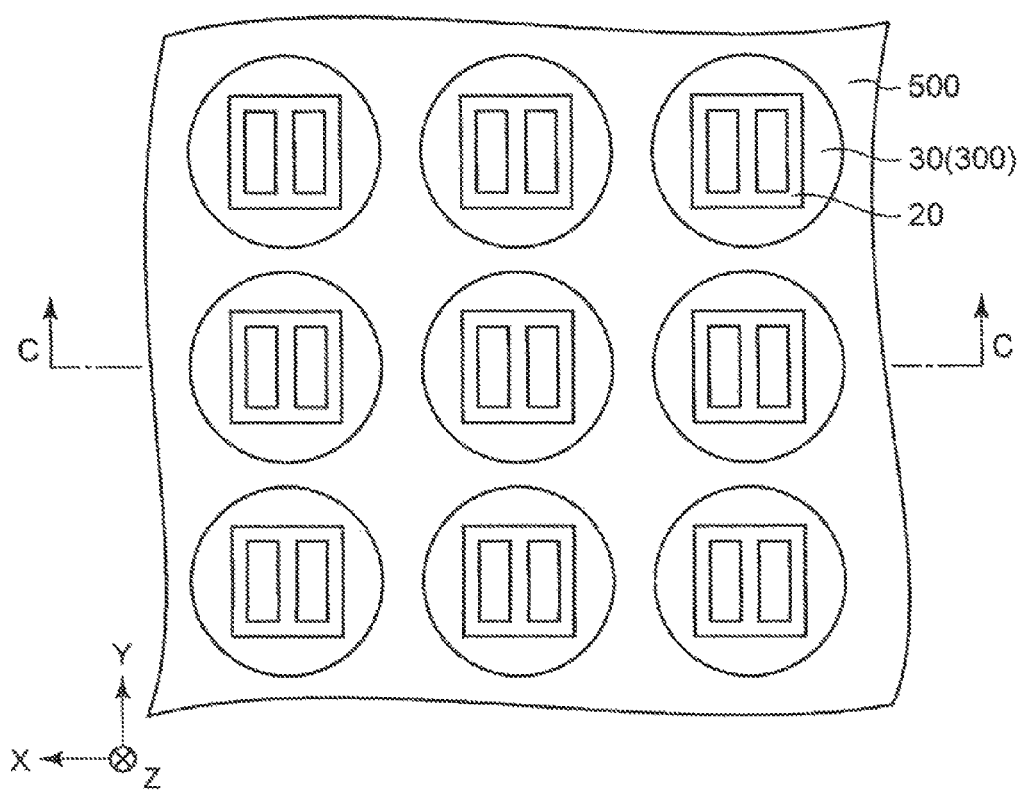
FIG. 4A is a schematic plan view illustrating a case where a light-emitting element is arranged, in a step 2-2 in the manufacturing method for the light-emitting device according to the second embodiment.
Figure 4B:
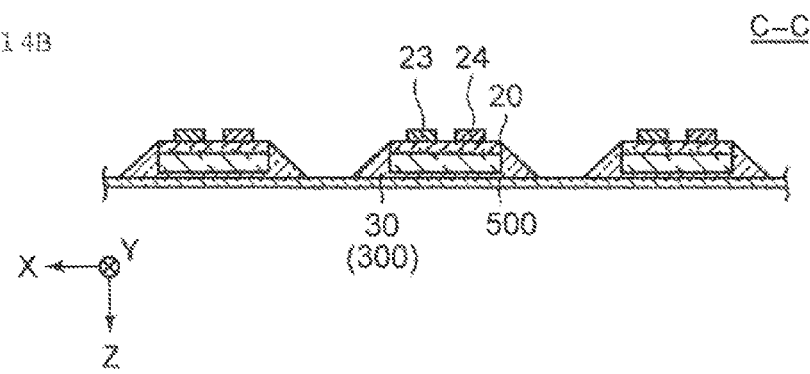
FIG. 4B is a schematic cross-sectional view illustrating a case where a light-emitting element is arranged, in a step 2-2 in the manufacturing method for the light-emitting device according to the second embodiment.

Next, as illustrated in FIGS. 4A and 4B, the light-emitting elements 20 are arranged on each liquid resin material 300 formed in an insular shape. In the case where the light-emitting element 20 is arranged on the liquid resin material 300 formed in an insular shape, the liquid resin material 300 climbs up the lateral surface of the light-emitting element 20, and the outer surface of the liquid resin material 300 is formed in a shape expended downward. After the light-emitting element 20 is arranged, the light-emitting element 20 may be pressed. After the light-emitting element 20 is arranged, the liquid resin material 300 is hardened. Thus, the light transmissive member 30 can be formed in the aforementioned manner. It is noted that in FIG. 5 onward, the light transmissive member 30 is not illustrated between the light-emitting element 20 and the wavelength conversion member 500 to simplify the drawings, but the membranous light transmissive member 30 exists between the light-emitting element 20 and the wavelength conversion member 500. The membranous light transmissive member formed by hardening the membranous liquid resin material 300 functions as an adhesive between the wavelength conversion sheet 500 and the light-emitting element 20.

Step 2-3. Formation of Coating Member 400

Figure 5A:
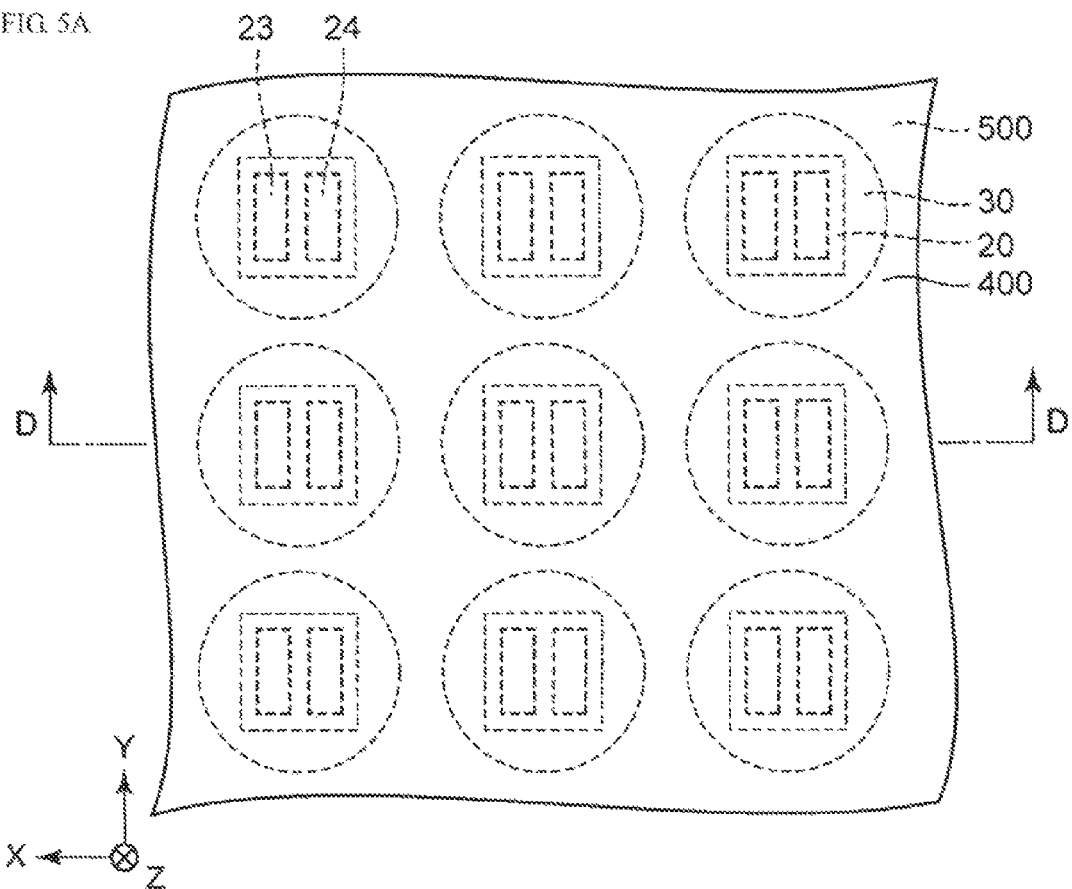
FIG. 5A is a schematic plan view illustrating a case where a coating member for coating the light-emitting element is formed, in a step 2-3 in the manufacturing method for the light-emitting device according to the second embodiment.
Figure 5B:
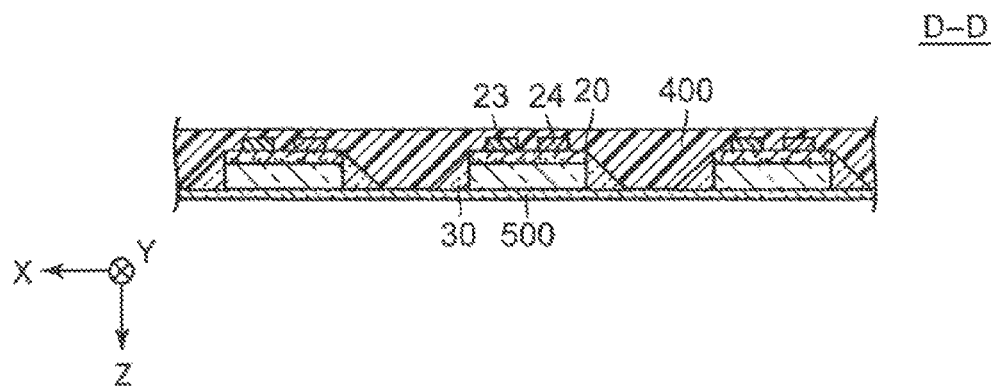
FIG. 5B is a schematic cross-sectional view illustrating a case where a coating member for coating the light-emitting element is formed, in a step 2-3 in the manufacturing method for the light-emitting device according to the second embodiment.
Figure 6A:
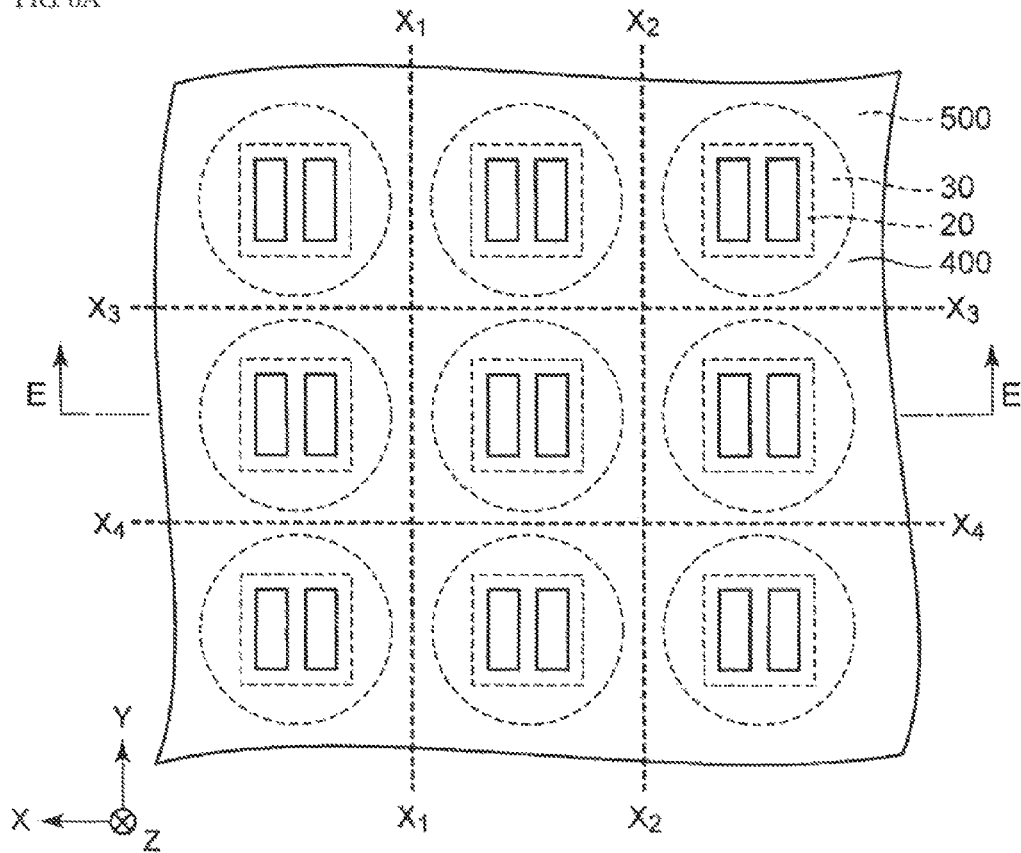
FIG. 6A is a schematic plan view illustrating a case where after the coating member for coating the light-emitting element is formed, the electrode of the light-emitting element is exposed, in the step 2-3 in the manufacturing method for the light-emitting device according to the second embodiment.
Figure 6B:
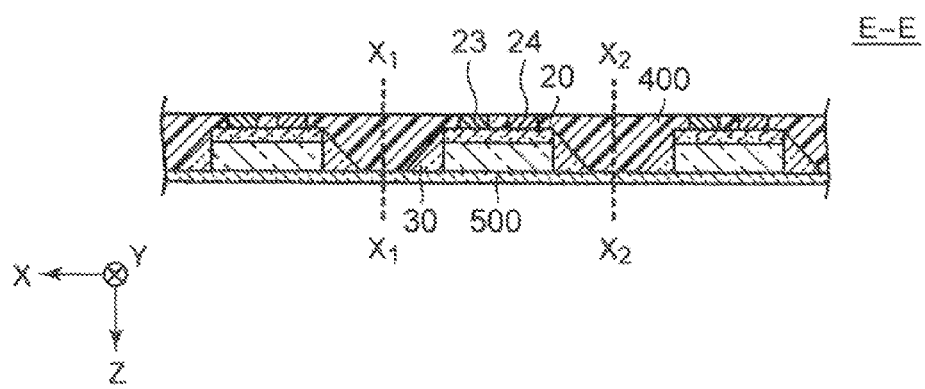
FIG 6B is a schematic cross-sectional view illustrating a case where after the coating member for coating the light-emitting element is formed, the electrode of the light-emitting element is exposed, in the step 2-3 in the manufacturing method for the light-emitting device according to the second embodiment.

Next, as illustrated in FIGS. 5A and 5B, the surface of the light-emitting element 20 and the light transmissive member 30 and the upper surface of the wavelength conversion sheet 500 on the outer side of the light transmissive member 30 are covered with a coating member 400, for example, made of silicone resin that contains approximately 60 wt % of silica and white titanium oxide, on the upper surface of the wavelength conversion sheet 500. After the separation of the light-emitting devices 12, the coating member 400 is turned into the coating member 40. The thermal conductivity of the coating member 40 in this embodiment is about 0.3 W/(m·K). After the hardening of the coating member 40, as illustrated in FIGS. 6A and 6B, the thickness of the coating member 400 is reduced by known machining methods in such a manner that the electrodes 23 and 24 of the light-emitting element 20 are exposed. During the machining, it is possible that a machining mark or dirt may remain on the surface of the coating member 400. This machining mark or dirt can be removed in patterning described later.

Step 2-4. Formation of Metal Layer

Figure 7A:
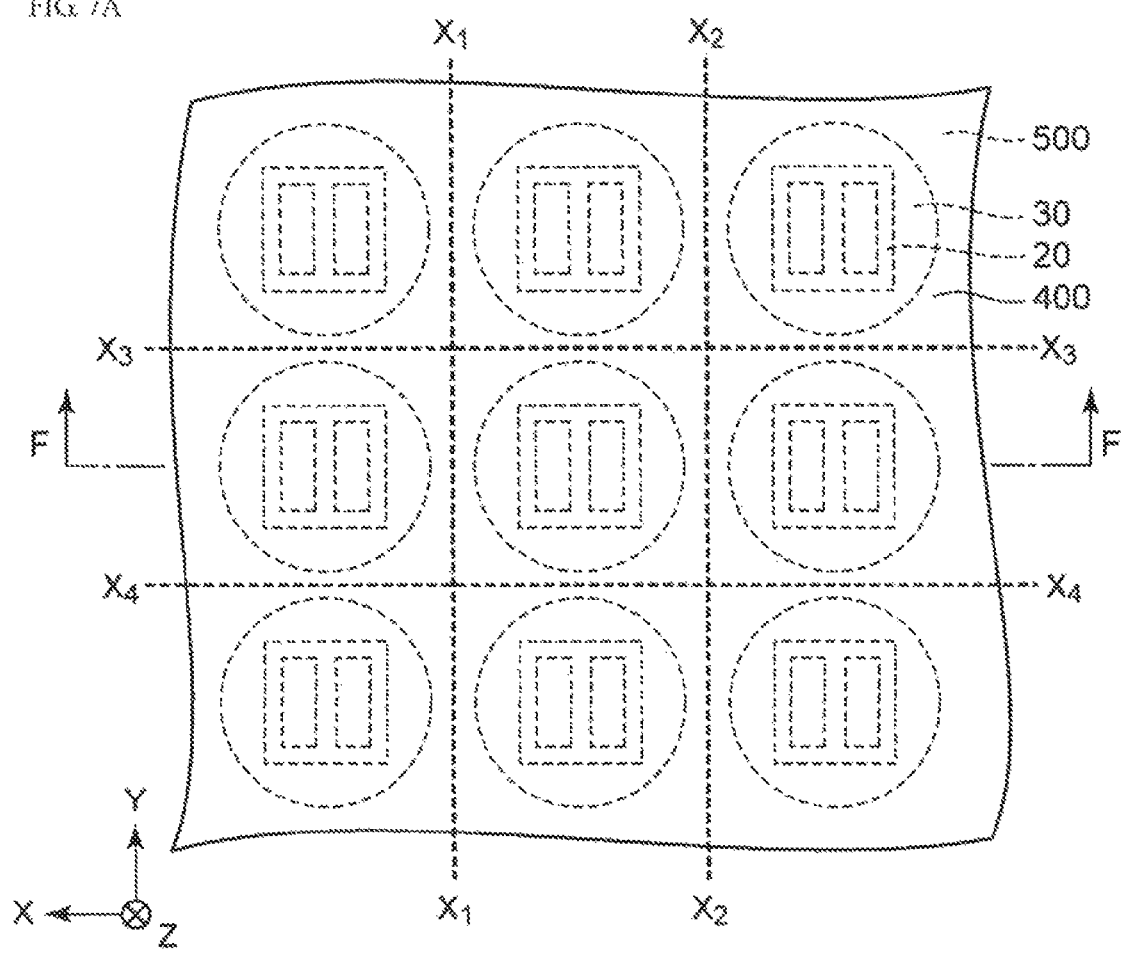
FIG. 7A is a schematic plan view illustrating a case where the metal layer is formed on the exposed electrode of the light-emitting element and the surface of the coating member, in a step 2-4 in the manufacturing method for the light-emitting device according to the second embodiment.
Figure 7B:
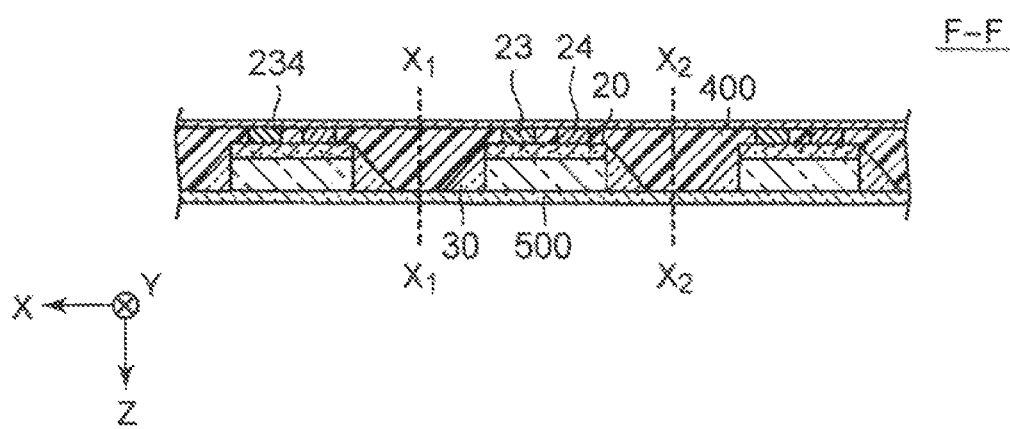
FIG 7B is a schematic cross-sectional view illustrating a case where the metal layer is formed on the exposed electrode of the light-emitting element and the surface of the coating member, in a step 2-4 in the manufacturing method for the light-emitting device according to the second embodiment.

Next, as illustrated in FIGS. 7A and 7B, a metal layer 234 is formed, which is continuously disposed on the exposed electrodes 23 and 24 and the surface of the coating member 400. The metal layer 234 includes, for example, an Ni layer and an Au layer and is formed such that the Ni layer having a 500 Å (50 nm) thickness and the Au layer having a 500 Å (50 nm) thickness are, for example, sputtered in the aforementioned order, on the entire surface of the coating member 400, including the surfaces of the electrodes 23 and 24. It is preferable that the metal layer 234 is formed in the thickness of 10000 Å (1000 nm) or less, more preferably, 1000 Å (100 nm) or less, in consideration of the patterning according to the irradiation of the laser beam. Therefore, the Ni layer and the Au layer may have thicknesses oilier than 500 Å (50 nm).

Step 2-5. Patterning of Metal Layer

Figure 8A:
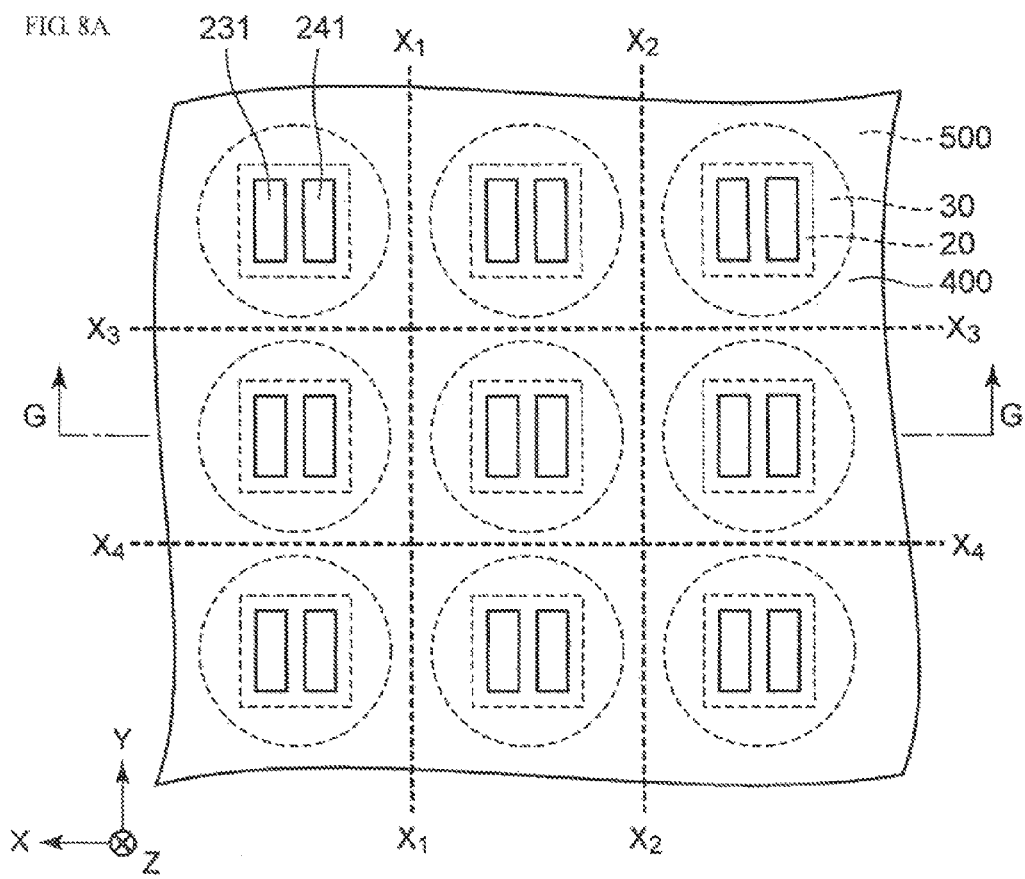
FIG. 8A is a schematic plan view illustrating a case where the entire metal layer is irradiated with a laser beam such that a portion of the metal layer on the electrode of the light-emitting element remains, and a portion of the metal layer on the coating member is removed, in a step 2-5 in the manufacturing method for the light-emitting device according to the second embodiment.
Figure 8B:
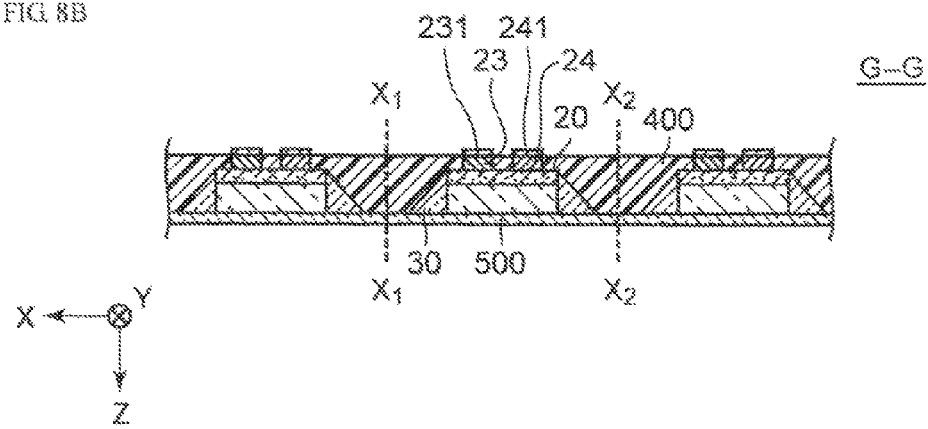
FIG. 8B is a schematic cross-sectional view illustrating a case where the entire metal layer is irradiated with a laser beam such that a portion of the metal layer on the electrode of the light-emitting element remains, and a portion of the metal layer on the coating member is removed, in a step 2-5 in the manufacturing method for the light-emitting device according to the second embodiment.

As illustrated in FIGS. 8A and 8B, the metal layer 234 is irradiated with the laser beam, resulting in the metal layer formed on the electrodes 23 and 24 remaining, and the metal layer formed on the coating member 400 being removed. For example, in the case where the electrodes 23 and 24 of the light-emitting element 20 are made of Cu, and the coating member 400 is comprised of silicone resin that contains silica and titanium oxide, a green laser beam having a wavelength of 532 nm, of which the output is 1 W to 4 W, preferably, approximately 2 W, is used in the irradiation.

Step 2-6. Separation of Light-emitting Devices 12

Figure 9A:
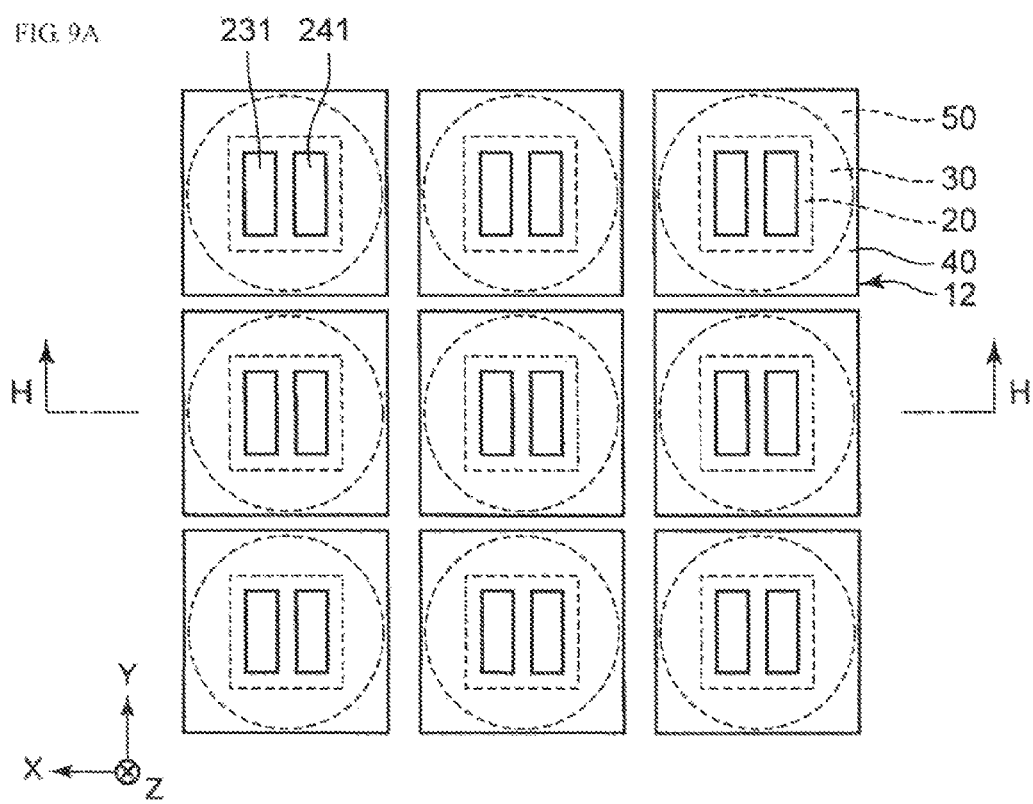
FIG. 9A is a schematic plan view illustrating a case where the segmentation of the light-emitting devices is performed in a step 2-6 in the manufacturing method for the light-emitting device according to the second embodiment.
Figure 9B:
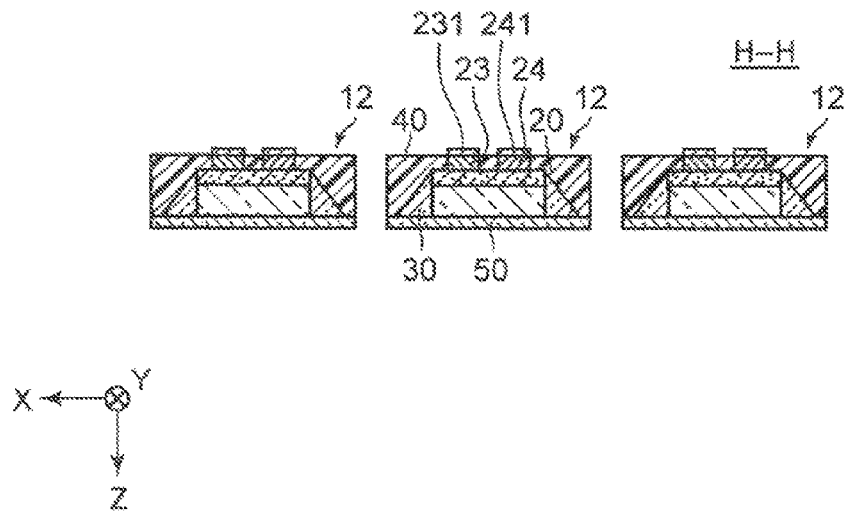
FIG. 9B is a schematic cross-sectional view illustrating a case where the segmentation of the light-emitting devices is performed in a step 2-6 in the manufacturing method for the light-emitting device according to the second embodiment.

Lastly, the coating member 400 and the wavelength conversion sheet 500 are cut with a dicer and the like along dashed lines $X_1$, $X_2$, $X_3$, and $X_4$, each of which passes through the middle of the adjacent light-emitting elements 20 illustrated in FIGS. 8A and 8B. Accordingly, the coating member 400 and the wavelength conversion sheet 500 are divided into individual light-emitting devices 12 (FIGS. 9A and 9B). Thus, a plurality of light-emitting devices 12, each of which includes one light-emitting element 20, can be simultaneously manufactured.

Hereinafter, materials suitable for each constituent member of the light-emitting device 12 of the second embodiment will be described.

Light-emitting Element 20

As the light-emitting element 20, a semiconductor light-emitting element, for example, a light-emitting diode can be employed. The semiconductor light-emitting element includes, for example, the light transmissive substrate 21 and the semiconductor stacked body 22 formed on the light transmissive substrate 21. The light-emitting element 20 can be formed in a polygon such as a triangle, square, or hexagon in a plan view. As for the dimensions, one side of the light-emitting element 20 can be, for example, from approximately 100 μm to 3000 μm in a plan view. Specifically, the light-emitting element 20 can be formed in a square of which one side is approximately 600 μm, 1400 μm, or 1700 μm. The light-emitting element 20 may be formed in a rectangle including long sides and short sides in a plan view. For example, the light-emitting element 20 may have the dimensions 1100 μm×200 μm. The light-emitting element 20 can be preferably employed for the light-emitting device of a lateral surface light emission type.

Light Transmissive Substrate 21

As for the light transmissive substrate 21 of the light-emitting element 20, for example, materials having insulation properties, such as sapphire ($Al_2O_3$), which has light transmissivity, or semiconductor materials such as a nitride semiconductor can be employed.

Semiconductor Stacked Body 22

The semiconductor stacked body 22 includes a plurality of semiconductor layers. As one example, the semiconductor stacked body 22 includes three semiconductor layers, that is, a first conductive type semiconductor layer (e.g., an n-type semiconductor layer), a light emission layer (an active layer), and a second conductive type semiconductor layer (e.g., a p-type semiconductor layer). The semiconductor layer can be formed, for example, with semiconductor members such as group III-V compound semiconductors and group II-VI compound semiconductors. In certain embodiments, nitride based semiconductors such as $In_xAl_yGa_{1-X-Y}N$ ($0 \leq X$, $0 \leq Y$, $X+Y \leq 1$) semiconductor members (e.g., InN, AlN, GaN, InGaN, AlGaN, and InGaAlN) can be employed.

Electrodes 23 and 24

A good electrical conductor can be employed for the electrodes 23 and 24 of the light-emitting element 20, which correspond to the first member 1 of the first embodiment. For example, metal such as Cu, Ag, and Ni is preferable. The electrodes 23 and 24 may slightly protrude from the coating member 40.

Metal Layers 231 and 241

The metal layers 231 and 241 are films that are formed so as to reduce the corrosion or oxidation of the surface of the electrodes 23 and 24, for example. The material that has good corrosion resistance and oxidation resistance can be selected, as compared with the material of electrodes 23 and 24. For example, it is preferable that the uppermost layer of the metal layers 231 and 241 be made of noble metal such as Au or Pt. Also, in the case where the metal layers 231 and 241 cover the surface so be soldered in the light-emitting device, it is preferable that Au that has good soldering properties be used on the uppermost surface. The metal layers 231 and 241 may be comprised of one layer made of a single material or may be comprised of stacked layers made of different materials. Examples of stacked layers include Ni/Au as described in the second embodiment, Ti/Au, and Ni/Pt/Au. In certain embodiments, a layer made of Ni or Ti is provided between the electrode and the uppermost surface layer, so that the adhesion properties of the uppermost surface layer can be enhanced. In certain embodiments, a diffusion prevention layer made of Pt and the like is provided between the electrode and the uppermost surface layer, so that Sn included in the solder used for soldering can be prevented from diffusing into the electrode or the layer close to the electrode. In the case where the electrodes 23 and 24 slightly protrude from the coating member 40, the lateral surfaces of portions that protrude from the coating member 40 may be covered with the metal film. Accordingly, the deterioration on the lateral surfaces of the electrodes 23 and 24 can be reduced. The thickness of the metal layers 231 and 241 can be selected in various forms. The thickness of the metal layers 231 and 241 can be formed to the extent that the laser ablation is selectively generated, and for example, it is preferable that the metal layers 231 and 241 be formed in the thickness of 10000 Å (1000 nm) or less, more preferably, 1000 Å (100 nm) or less. Also, it is preferable that the metal layers 231 and 241 be formed in the thickness with which the corrosion of the first member can be reduced, for example, 5 nm or more. Herein, in the case where the metal layers 231 and 241 are comprised by stacking a plurality of layers, the thickness of the metal layers 233 and 241 means the total thickness of the plurality of layers.

Light Transmissive Member 30

The light transmissive member 30 can be formed of light transmissive materials such as light transmissive resin or glass. As the light transmissive resin, it is preferable that the light transmissive resin having thermosetting properties, in particular, such as silicone resin, silicone modified resin, epoxy resin, and phenol resin, be used. The light transmissive member 30 is in contact with the lateral surface of the light-emitting element 20, so that light transmissive member 30 is susceptible to the heat generated in the light-emitting element 20 at the time of lighting up. Thermosetting resin having good thermal resistance is suitable for the light transmissive member 30. Among them, the silicone resin that has a high degree of reliability is preferable. It is preferable that the light transmissive member 30 have high light transmissivity. For this reason, in certain embodiments, it is preferable that additives that reflect, absorb, or diffuse the light should not be normally added to the light transmissive member 30. However, in certain embodiments, additives may be added to the light transmissive member 30 so as to obtain desirable properties. For example, various fillers may be added to the light transmissive member 30 so as to adjust the refractive index of the light transmissive member 30 or to adjust the viscosity of the light transmissive member 30 (the liquid resin material 360) prior to hardening.

Coating Member 40

The material of the coating member 40, which corresponds to the second member 2 of the first embodiment, is selected such that the thermal conductivity of the coating member 40 is different from that of the electrodes 23 and 24 of the light-emitting element 20, which correspond to the first member 1 of the first embodiment. Specifically, the material used for the coating member 40 includes resin or ceramics. In certain embodiments, resin is preferable.

As the resin materials used for the coating member 40, it is preferable that the resin having thermosetting properties, for example, silicone resin, silicone modified resin, epoxy resin, or phenol resin, may be employed.

The coating member 40 can be formed of resin having light reflectivity. The resin having light reflectivity refers to a resin material of which the reflectivity with respect to the light from the light-emitting element 20 is high, for example, 70 percent or higher. The light that has reached the coating member 40 is reflected and directed to the light emission surface of the light-emitting device 12, thereby enhancing the efficiency of light extraction of the light-emitting device 12.

As the resin having light reflectivity, for example, a material in which a substance having light reflectivity is diffused into the light transmissive resin can be used. As the substance having light reflectivity, for example, zinc oxide, silicon oxide, titanium oxide, zirconium oxide, potassium titanate, aluminum oxide, aluminum nitride, boron nitride, or mullite is preferably used. The substance having light reflectivity, which is formed in a granular, fibrous, or thin-plate shape, can be employed. It is expected that the substance formed in the fibrous shape has the effect of reducing the coefficient of thermal expansion of the coating member 40, which is preferable.

In the ease where the coating member 40 is comprised of the resin that includes, for example, a filler such as the substance having light reflectivity, a resin component on the surface irradiated by the laser beam may be removed by the laser ablation, and the filler may be exposed on the surface. Also, the irradiation spot of the laser beam is continuously or intermittently (sequentially) applied on the surface, as described above, thereby forming the grooves in stripes in the moving direction. The grooves depend on the diameter of the irradiation spot of the laser beam. For example, the grooves may be formed such that the width thereof ranges from approximately 10 to 100 μm, more specifically, approximately 30 μm, and the depth thereof ranges from approximately 0.2 to 3 μm. In the case where the grooves are formed in the coating member 40 including the resin component, the viscosity (tack property) on the surface of the coating member 40 can be reduced, and for example, there is an advantage in that the selection of the light-emitting device or handling during the mounting is facilitated. As the resin component of the coating member 40, it is preferable that silicone be used so as to enhance reliability. However, the viscosity of the silicone is high, and therefore, when silicone is used in the light-emitting device, it may be difficult to handle the light-emitting device. In contrast, in certain embodiments where the grooves are formed by the irradiation of the light-emitting device using the coating member 40 including silicone, the tack properties on the surface of the coating member 40 can be reduced, and the light-emitting device that is easy to handle and has high reliability can be provided. Furthermore, in the certain embodiments in which the grooves extend in a direction orthogonal to the shortest distance between the electrodes 23 and 24, a distance along the surface between the electrodes 23 and 24 can be increased, so that the electrodes 23 and 24 can be efficiently insulated and separated.

It is preferable that the coating member be formed of a material in which the coefficients of thermal expansion of the light transmissive member 30 and the light-emitting element 20 bear a predetermined relation. That is, it is preferable that the material of the coating member 40 be selected in such a manner that a difference $\Delta T_{40}$ coefficients of thermal expansion between the coating member 40 and the light-emitting element 20 is smaller than a difference $\Delta T_{30}$ in coefficients of thermal expansion between the light transmissive member 30 and the light-emitting element 20. For example, in an example where the light-emitting element 20 includes the light transmissive substrate 21 made of sapphire and the semiconductor stacked body 22 made of GaN based semiconductors, the coefficient of thermal expansion of the light-emitting element 20 approximately reaches 5 to $9 \times 10^{-6}$/K. In contrast, in the example where the light transmissive member 30 is formed of the silicone resin, the coefficient of thermal expansion of the light transmissive member 30 reaches 2 to $3 \times 10^{-5}$/K. Accordingly, the coating member 40 is formed of a material of which the coefficient of thermal expansion is smaller than that of the silicone resin, so that $\Delta T_{40} < \Delta T_{30}$ can be established.

In certain embodiments where the resin material is used for the coating member 40, the coefficient of thermal expansion is generally of $10^{-5}$/K order, which is larger than one digit, compared with the coefficient of thermal expansion of the general light-emitting element 20. However, the coefficient of thermal expansion of the resin material can be reduced by adding the filler or the like to the resin material. For example, the filler such as silica is added to the silicone resin, thereby reducing the coefficient of thermal expansion, compared with the silicone resin before adding the filler.

Wavelength Conversion Member 50

The wavelength conversion member 50 includes a phosphor and a light transmissive material. A light transmissive resin or glass can be used for the light transmissive material. In particular, the light transmissive resin is preferable, and thermosetting resin such as silicone resin, silicone modified resin, epoxy resin, or phenol resin, or thermoplastic resin such as polycarbonate resin, acrylic resin, methylpentene resin, or polynorbornene resin can be used. In particular, silicone resin that excels in light resistance and thermal resistance is preferable.

Phosphors that can be excited by the light emitted from the light-emitting element 20 are used. For example, the phosphors that can be excited by a blue light-emitting element or an ultraviolet light-emitting element include: yttrium aluminum garnet based phosphor(Ce:YAG) activated by cerium; lutetium aluminum garnet based phosphor (Ce:LAG) activated by cerium; nitrogen-containing calcium aluminosilicate based phosphor ($CaO$—$Al_2O_3$—$SiO_2$) activated by europium and/or chromium; silicate based phosphor (($Sr, Ba)_2SiO_4$) activated by europium; β sialon phosphor; CASN based phosphor; nitride based phosphor such as SCASN based phosphor; KSF ($K_2SiF_6$:Mn) based phosphor; sulfide based phosphor; and quantum dot phosphor. The light-emitting devices that emit various colors (for example, the light-emitting device that emits white light) can be manufactured by combining the aforementioned phosphors and the blue light-emitting element or the ultraviolet light-emitting element. Various fillers and the like may be contained in the wavelength conversion member 50 for the purpose of adjusting the viscosity.

Figure 2E:
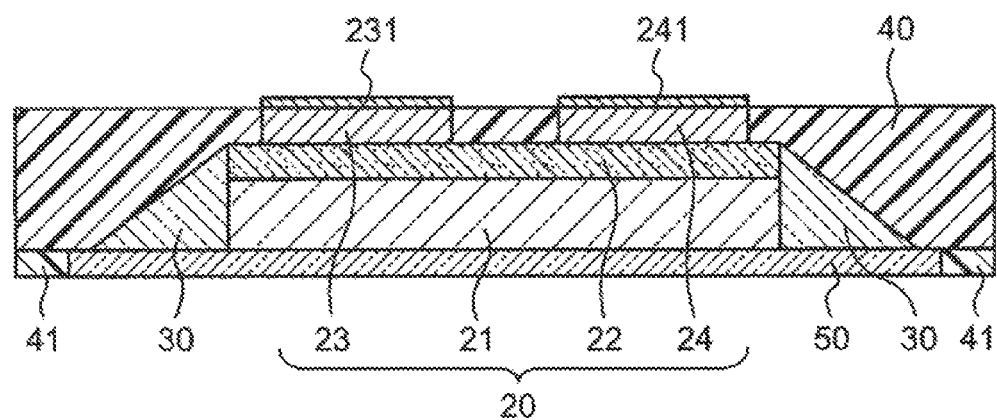
FIG. 2E is a schematic plan view of the light-emitting device as a modified example according to the second embodiment of the present invention, which includes a light shielding wall.

The surface of the light-emitting element may be covered with the light transmissive material that does not include the phosphor, in place of the wavelength conversion member 50. Also, a variety of fillers may be added to the aforementioned light transmissive material, for example, for the purpose of adjusting the viscosity. It is noted that a light shielding wall 41 may be provided on the outer circumference of the wavelength conversion member 50 as illustrated in FIG 2E. Accordingly, the directivity of the light emitted from the light-emitting device 12 is enhanced. The light shielding wall 41 may be a member continuously disposed with the coating member 49.

The embodiments according to the present invention have been described above, but the present invention is not limited to the descriptions above. Needless to say, the present invention can be arbitrarily applied within the scope of the gist of the present invention.

What is claimed is:

1. A metal coating method comprising:
   providing a substrate that includes:
      a first member having a first surface, and
      a second member having a second surface,
      wherein the first surface and the second surface are coplanar, and
      wherein a thermal conductivity of the second member is lower than a thermal conductivity of the first member;
   forming a metal layer on the first surface and the second surface; and
   irradiating the metal layer formed on the first surface and the second surface with a laser beam such that, after irradiation, a portion of the metal layer formed on the first surface remains, and a portion of the metal layer formed on the second surface is removed.

2. The metal coating method according to claim 1, wherein the metal layer is formed continuously on the first surface and the second surface.

3. The metal coating method according to claim 1, wherein during irradiation with the laser beam, an irradiation spot of the laser beam is continuously applied on a surface of the metal layer.

4. The metal coating method according to claim 1, wherein during irradiation with the laser beam, an irradiation spot is intermittently applied on a surface of the metal layer.

5. The metal coating method according to claim 1, wherein during irradiation with the laser beam, the portion of the metal layer formed on the second surface is removed by laser ablation.

6. The metal coating method according to claim 1, wherein the metal layer is formed on substantially an entire surface of the substrate including the first surface and the second surface, and the laser beam irradiates substantially an entire surface of the metal layer.

7. The metal coating method according to claim 1, wherein the first member is an electrode of a light-emitting element, and the second member is a coating member that coats the light-emitting element.

8. The metal coating method according to claim 1, wherein the first member is comprised of metal, and the second member is comprised of resin.

9. The metal coating method according to claim 1, wherein the first member is comprised of copper, and the metal layer is comprised of a stack of a nickel layer and a gold layer.

10. The metal coating method according to claim 1,
wherein the thermal conductivity of the first member is 500 times or greater than the thermal conductivity of the second member.

11. A manufacturing method for a light-emitting device, the method comprising:
providing a structure comprising:
an electrode having a first surface, and
a coating member having a second surface,
wherein the first surface and the second surface are coplanar;
forming a metal layer on the first surface and the second surface; and
irradiating the metal layer formed on the first surface and the second surface with a laser beam such that, after irradiation, a portion of the metal layer formed on the first surface remains, and a portion of the metal layer formed on the second surface is removed.

12. The manufacturing method for a light-emitting device according to claim 11, wherein the metal layer is formed continuously on the first surface and the second surface.

13. The manufacturing method for a light-emitting device according to claim 11,
wherein during irradiation with the laser beam, an irradiation spot of the laser beam is continuously applied on a surface of the metal layer.

14. The manufacturing method for a light-emitting device according to claim 11,
wherein during irradiation with the laser beam, an irradiation spot is intermittently applied on a surface of the metal layer.

15. The manufacturing method for a light-emitting device according to claim 11,
wherein during irradiation with the laser beam, the portion of the metal layer formed on the second surface is removed by laser ablation.

* * * * *